United States Patent
Hossain

(10) Patent No.: US 7,571,402 B2
(45) Date of Patent: Aug. 4, 2009

(54) SCAN CHAIN MODIFICATION FOR REDUCED LEAKAGE

(75) Inventor: Razak Hossain, San Diego, CA (US)

(73) Assignee: STMicroelectronics, Inc., Carrollton, TX (US)

(*) Notice: Subject to any disclaimer, the term of this patent is extended or adjusted under 35 U.S.C. 154(b) by 440 days.

(21) Appl. No.: 10/604,964

(22) Filed: Aug. 28, 2003

(65) Prior Publication Data

US 2005/0050416 A1 Mar. 3, 2005

(51) Int. Cl.
G06F 17/50 (2006.01)
(52) U.S. Cl. .................. 716/5; 716/4; 716/6; 714/726; 714/727; 714/728; 714/729; 714/730; 714/731
(58) Field of Classification Search ................ 716/4–6; 714/726–731
See application file for complete search history.

(56) References Cited

U.S. PATENT DOCUMENTS

| | | | | |
|---|---|---|---|---|
| 5,912,850 A | * | 6/1999 | Wood et al. ................. | 365/201 |
| 5,926,487 A | * | 7/1999 | Chappell et al. ............ | 714/731 |
| 6,946,903 B2 | * | 9/2005 | Marshall et al. ............ | 327/566 |
| 7,058,834 B2 | * | 6/2006 | Woods et al. ............... | 713/324 |
| 7,188,286 B2 | * | 3/2007 | Dervisoglu et al. ......... | 714/727 |
| 7,412,637 B2 | * | 8/2008 | Wang et al. ................. | 714/729 |

OTHER PUBLICATIONS

Abdollahi et al. "Leakage current reduction in sequential circuits by modifying the scan chains", Fourth international symposium on Mar. 24-28, 2003.*
De, Vivek et al., Techniques for Leakage Power Reduction, Design of High-Performance Microprocessor Circuits, IEEE Press, Chap. 3, pp. 46-62, 2001.
Aloul, Padi A., et al., "Robust SAT-Based Search Algorithm for Leakage Power Reduction", International Workshop on Power and Timing Modeling, Optimization and Simulation, Seville, Spain, 2002.

* cited by examiner

*Primary Examiner*—Naum B Levin
(74) *Attorney, Agent, or Firm*—Lisa K. Jorgenson; William A. Munck

(57) ABSTRACT

A leakage power control vector is loaded into existing test scan chain elements for application to circuit elements of a circuit in which the leakage currents are to be controlled. The vector is designed to configure the circuit elements into states in which leakage currents are reduced. A multiplexer selects the power control vector for loading into the scan chain elements, and a clock generator clocks the configuration vector into the scan chain elements. A sleep mode detector may be provided to configure the multiplexer to select the power control vector and to operate the clock generator to clock the power control vector into the scan chain elements when a sleep mode of the circuit is detected.

16 Claims, 2 Drawing Sheets

SCAN CHAIN MODIFICATION FOR REDUCED LEAKAGE

BACKGROUND OF INVENTION

1. Field of Invention

This invention relates to circuit improvements, and more particularly to methods and circuits for reducing leakage currents in circuits.

2. Relevant Background

A strong correlation has been shown to exist between the input vector applied to a logic cell and the leakage current through it. For example, for a 2-input static AND cell, it has been reported that the total drain to source leakage current when both the inputs are at logic 1 is 50 times greater than when the inputs are at logic 0.

As process technologies continue to scale, leakage power becomes an increasingly important part of the total power dissipation of the chip. This is as threshold voltages and gate lengths are reduced in finer geometry processes, leading to increased leakage current. In addition, with significant gate oxide scaling, leakage current starts to occur through the transistor gates. Leakage power is especially crucial in portable devices, such as cell phones, where it can directly affect the operating time before which the device needs to be recharged.

One solution that has been proposed is to determine whether a logic 1 or logic 0 value at the gate of a particular device is likely to minimize leakage of the device. Then, a vector is loaded into the latches of the circuit where leakage power dissipation is to be minimized. Thus, the latches apply a logic 1 or logic 0 value, as needed. This may be, for example, in response to a "standby" signal applied to or generated by the circuit.

As integrated circuits become increasingly complex, mechanisms for testing have been designed into the circuits. A typical testing mechanism is a "scan-chain". A scan chain typically includes a linked set of flip-flops, and usually, serially provided data is introduced into a flip-flop at one end of the chain and is clocked sequentially into the scan chain, over a number of clock cycles. The scan chain applies the test input (TI) data to various circuit elements, which produce a known output if operating correctly. If an output other than the expected known output is produced, an error in the circuit is indicated. The set of TI data that is clocked into the scan chain is often referred to as a vector, and, more particularly, is referred to herein as a test vector.

The flip-flops are configurable to accept either the test vector in a test mode or data in a normal operating mode. Thus, a test enable (TE) signal is accepted by the flip-flops of the scan chain to essentially multiplex either the test vector or the actual data for application to the circuit.

Another technique to reduce leakage power is to use large shut-off transistors which are provided to the power source. This technique requires significant layout overhead and also leads to power supply integrity issues.

SUMMARY OF INVENTION

One of the advantages realized by the invention is that by using the existing scan chain in the design, no modifications need to be made to the flip-flops or latches in the design. This means that there is no timing impact on the critical paths.

Another advantage of the invention is that no extra area or power overhead is required by having to use more complex flip-flops or latches, which were required by the prior art.

Still another advantage of the invention is that by not routing the sleep signal (also referred to as the "standby" signal) to each flip-flop, area penalties are avoided, as well as routing congestion and power dissipation in the design.

These and other objects, features and advantages of the invention will be apparent to those skilled in the art from the following detailed description of the invention, when read in conjunction with the accompanying drawings and appended claims.

The method and circuits of the invention provide a mechanism by which a set of low leakages vectors can be applied to a circuit when its inputs are not changing. The idea is that during the sleep period a set of low leakage vectors are loaded into the flip-flops of the design by using the scan chain (after which the clock signal provided to the flip-flops can be shut off.) While some extra power is dissipated in loading the low leakage signals it should be remembered that even if the sleep period lasts several seconds, it could represent many billions of clock cycles. Across so many cycles the power dissipated in loading the low leakage vectors would pale in insignificance compared to the total leakage power.

Thus, according to a broad aspect of the invention, a circuit is presented that includes scan chain elements to contain a vector for selective application to circuit elements of the circuit. A vector memory contains a configuration vector which, when applied to the circuit elements, configures the circuit elements into a state in which a leakage current is reduced. A multiplexer selects the configuration vector for loading into the scan chain elements, and a clock generator clocks the configuration vector into the scan chain elements. In one embodiment, a sleep mode detector is provided to configure the multiplexer to select the configuration vector and to operate the clock generator to clock the configuration vector into the scan chain elements when a sleep mode of the circuit is detected.

According to another broad aspect of the invention, a method is presented for reducing leakage currents in a circuit. The method includes clocking a configuration vector into scan chain elements for application to circuit elements within the circuit. The configuration vector configures the circuit elements into a state in which leakage currents are minimized. In one embodiment, the method includes detecting a sleep mode, and in response thereto performing the clocking. In another embodiment, the method also includes turning off clock pulses to the scan chain elements after the configuration vector has been applied to the circuit elements.

According to still another broad aspect of the invention, a method for reducing leakage currents in a circuit is presented. The method includes determining a vector having first states which if applied to circuit elements of the circuit results in lower leakage currents than second states, detecting an operating mode of the circuit, such as a sleep or standby mode, and clocking the vector into scan chain elements of the circuit for application thereby to the circuit elements when the operating mode is detected. In one embodiment, the method also includes turning off clock pulses to the scan chain elements after the vector has been applied to the circuit elements.

BRIEF DESCRIPTION OF DRAWINGS

The invention is illustrated in the accompanying drawing, in which.

DETAILED DESCRIPTION

Figure 1:
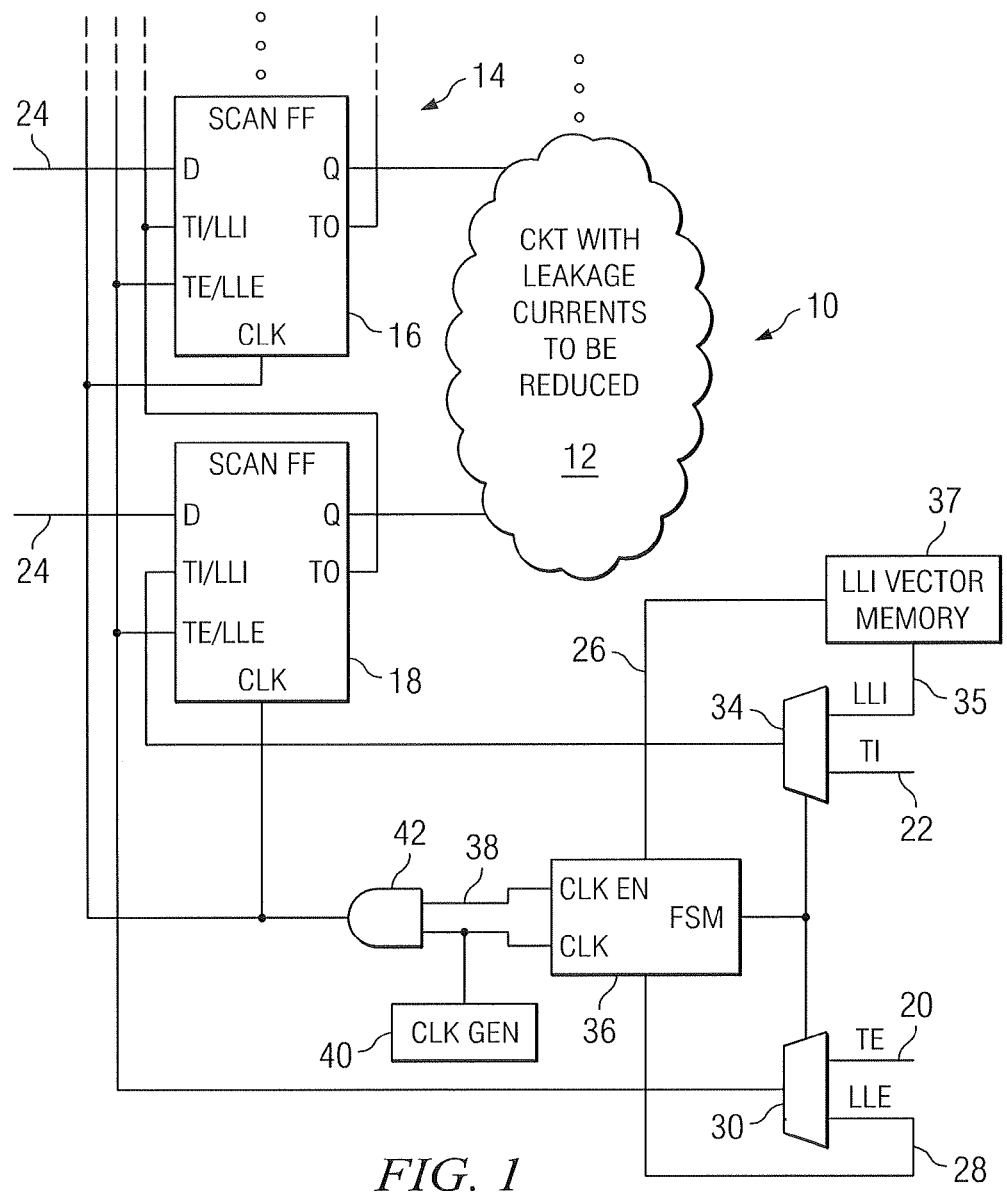
FIG. 1 is an electrical schematic diagram of a circuit having a scan chain test capability together with a leakage current reduction circuit, in accordance with a preferred embodiment of the invention.

One embodiment 10 of the invention is shown in FIG. 1, to which reference is now made. A preferred embodiment of the invention is particularly useful in conjunction with circuit or design 12 in which a scan chain test circuit 14 is already associated. In those circuits the scan-chain 14 is re-used to supply low leakage vectors to the flip-flops (not shown) of the circuit 12. That is, in addition to retaining the original test uses for the scan chain 14, the scan chain 14 is additionally used to contain a vector that reduces the leakage currents in the circuit elements of the circuit 12, in a manner below described in detail.

A typical scan chain 14 may include a large number of flip-flops; however, the scan chain shown includes only two flip-flop elements 16 and 18, for brevity, it being understood that many such flip-flop elements may be included in the scan-chain 14. The two scan-chain elements 16 and 18 shown are the same elements that would pre-exist in association with the circuit 12 with which the invention is employed. Typically, each flip-flop includes a D (data-in) input to which data is applied in normal operation, a TI (test-in) input to which a test vector is applied in test mode, and a TE (test-enable) input which controls the input to the flip-flop to be either the D input or the TI input. Thus, in normal testing operations, the scan-chain 14 is controlled by the TE signal 20, which controls whether the TI input 22 or standard D input 24 is loaded into each scan-chain flip-flop 16,18.

In the circuit embodiment 10 shown, when a sleep or standby mode signal occurs, the scan-chain 12 is enabled by a LLE (low leakage enable) signal 28 in place of the normal TE signal. This is implemented by a simple multiplexer 30, which receives the TI signal 20 on one input and the LLE signal 28 on another. The selection signal for the multiplexers 34 and 30, as well as the LLE signal 28 is controlled by a finite state machine (FSM) 36.

Also, according to the invention, the data inputted into the flip-flops 16 and 18 of the scan chain 14 is an LLI (low-leakage input) vector 35, instead of, the TI signal 22 that is used during scan testing. The LLI vector may be variously referred to herein as a low leakage input vector, a configuration vector, or a power control vector. This selection is also implemented with a multiplexer 34, which receives the TI signal 22 on one input and the LLI signal 35 on another.

Thus, a simple change at the input of the scan chain 14 can allow the scan chain 14 to load low leakage vectors in addition to scan testing vectors. The process of loading the low leakage vectors begins once a sleep signal is received or generated. The sleep signal may be generated, for example, in known fashion. One technique for providing the sleep signal may be, for example, on-chip, based on some time-out mechanism. Alternately, the sleep signal could be provided from off-chip sources. Those skilled in the art will recognize other sleep or standby mode signal generation techniques.

In any case, once the sleep signal is received, the LLE signal 28 is invoked for the desired scan chain elements 16,18, and the LLI vector 35 is scanned or loaded thereinto. The LLI vector 35 may be provided, for instance, from an on-chip memory device 37, from an off-chip source (not shown), or from another source. Generally, a control signal from the FSM 36 would initiate the delivery of the LLI vector 35, for example, by an enable signal on a line 26.

Figure 2:
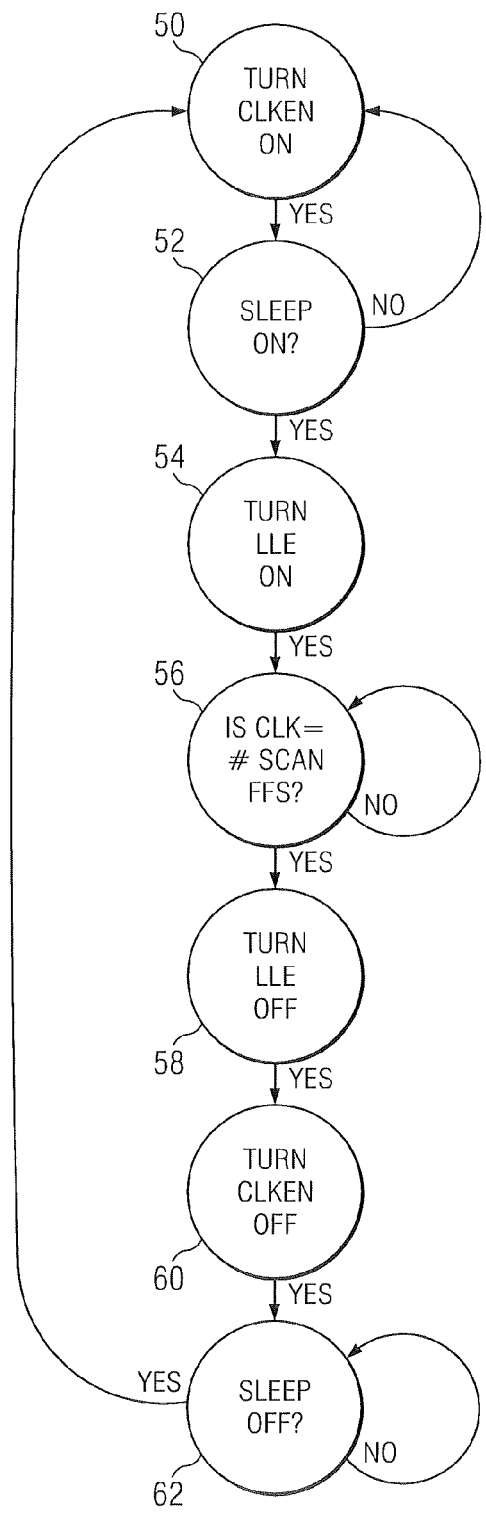
FIG. 2 is a state diagram showing an example of various states that may be assumed by a state machine in performing a method for reducing leakage currents in a circuit, in accordance with a preferred embodiment of the invention.

The FSM 36 may be used to ensure that the LLI inputs are serially available once the LLE signal 28 is turned on or selected via multiplexer 30. Various states that may be included in the finite state machine 36 are exemplified in FIG. 2, to which reference is now additionally made. The finite state machine 36 continually checks for a change of state of the sleep, or standby, mode signal, states 50 and 52, and while the circuit is not in sleep mode, allows clock signals from the clock generator 40 to apply clock pulses to the flip-flops 16,18 via clock enable signal 38 applied to AND gate 42.

Once a sleep mode is detected in state 52, the LLE signal is turned on, state 54. In order to ensure that the right vector values are placed in their corresponding scan-chain flip-flops 16,18, the LLE signal 28 must be activated for a number of cycles equal to the length of the scan chain 14 into which the LLI vectors are to be scanned. Preferably, this would include the entire scan-chain 14, but in some applications, may include a sub-set of the scan-chain.

Thus, the FSM 36 also receives (or generates) the sleep signal, and in response thereto controls the turn-on and turn-off of the LLI signal 35 by a signal on line 26. As mentioned, since different scan chain in the design are likely to have different chain lengths the FSM 36 must ensure that each scan chain will be only active for a specific number of cycles. Accordingly, the finite state machine 36 checks the number of clock pulses against the desired number of scan flip-flops into which the vector is to be clocked, state 56. After the low leakage vector, LLI, 35 has been loaded, the LLE signals for the scan chain are turned off, state 58.

In one embodiment of the invention, since there is no need to continue to clock the flip-flops 16,18 after the LLI vector 35 is loaded thereinto, the FSM controller 36 may then be used to send a clock gating signal 38 to the clock signals driving the scan chain flip-flops 16,18. In the embodiment shown, for example, the clock signals from a clock generator 40, which normally clock the flip-flops 16,18, are compared, for example, in an AND gate 42, with the normally high output 38 from the FSM 36, state 60. When the clock gating signal 38 from the FSM 36 goes low once the LLI vector 35 has been clocked into the flip-flops 16,18, the clock signals are blocked from clocking the flip-flops 16,18 further. This may be performed in state 62, in which the sleep mode is again monitored to ensure that it is still turned off. If it remains off, the flip-flops 16,18 are not clocked. This will lead to further power savings.

On the other hand, if the sleep mode is turned off, the state machine returns to state 50, removing the clock gating signal 38, allowing the flip-flops 16,18 to once again be clocked. The FSM 36 can be modified to return to state 50 (the sleep mode off state) during states 54, 56, 58 or 60 if the sleep signal is deactivated. The actual implementation will depend on the minimum length of sleep state possible. This is likely to be significantly longer than the number of clock cycles required to load the LLI vector if, for example, the PLL needs to powered up at the end of sleep.

The particular values of the LLI vector 35 that are applied to the scan chain may be pre-computed, for example based upon heuristic data or other data known about the particular devices in the circuit 12 to which they will be applied. It is assumed that a fully automated flow mechanism will be provided by which a memory to hold the LLI vectors 35 and FSM 36 will be generated once the logic is known. This is necessary as the input vectors that cause minimal leakage current are strongly dependent on the logical structure of the module.

Thus, it can be seen that the solution presented herein has at least two major advantages. First, by using the existing scan chain in the design, no modifications need to be made to the flip-flops or latches in the design. Therefore, the use of the method and circuitry of the invention will have essentially no timing impact on the critical paths. Second, there is no extra area or power overhead in having to use more complex flip-flops or latches. By not routing the sleep or standby signal to each flip-flop, the area penalty, routing congestion and power dissipation in the design are avoided.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

The invention claimed is:

1. A circuit, comprising:
   circuit elements;
   scan chain elements to contain a vector for selective application to said circuit elements;
   a vector memory for containing a configuration vector which, when applied to said circuit elements, configures said circuit elements into a state in which a leakage current is reduced;
   a multiplexer to select said configuration vector for loading into said scan chain elements, wherein said multiplexer is controlled by a finite state machine, and wherein the finite state machine includes sleep, standby and at least one other value;
   a clock generator to clock said configuration vector into said scan chain elements;
   a circuit for receiving a test vector for clocking into said scan chain elements;
   wherein said multiplexer is configured to select between said configuration vector and said test vector for loading into said scan chain elements; and
   wherein said clock generator is configured to clock said selected vector into said scan elements.

2. The circuit of claim 1 further comprising a sleep mode detector to configure said multiplexer to select said configuration vector and to operate said clock generator to clock said configuration vector into said scan chain elements when a sleep mode of said circuit is detected.

3. The circuit of claim 2 further comprising a scan chain turn off circuit to turn off a clock to said scan chain elements after said configuration vector has been applied to said circuit elements.

4. A circuit, comprising:
   circuit elements;
   scan chain elements to contain a vector for selective application to said circuit elements;
   a test input for receiving a test vector;
   a vector memory for containing a configuration vector which, when applied to said circuit elements, configures said circuit elements into a state in which a leakage current is reduced;
   a first multiplexer to select between said configuration vector and said test vector for loading into said scan chain elements wherein said first multiplexer is controlled by a finite state machine, and wherein the finite state machine comprises sleep, standby and at least one other mode;
   a second multiplexer to select between a test enable signal and a configuration vector enable signal and output a selected enable signal, said selected enable signal operable for enabling said scan chain elements to select between a first selected vector and a normal operation mode data vector for loading into said scan chain elements; and
   a clock generator generating a clocking signal to clock a second selected vector into said scan chain elements.

5. The circuit of claim 4 further comprising a sleep mode detector to configure said multiplexer to select said configuration vector and to operate said clock generator to clock said configuration vector into said scan chain elements when a sleep mode of said circuit is detected.

6. The circuit of claim 5 further comprising a scan chain turn off circuit to turn off a clock to said scan chain elements after said configuration vector has been applied to said circuit elements.

7. The circuit of claim 4 further comprising:
   a scan chain turn off circuit operable for disabling a clock signal to said scan chain elements after said configuration vector has been loaded into said scan chain elements.

8. The circuit of claim 4 wherein during a sleep mode, said configuration vector enable signal is only activated for a predetermined number of cycles of said clock generator equal to or less than the number of said scan chain elements.

9. The circuit of claim 7 further comprising:
   the finite state machine operable for receiving a sleep mode signal defining said sleep mode, and in response thereto, generating said configuration vector signal, controlling said first and second multiplexers, and in response to said sleep mode signal, and disabling said clocking signal to said scan chain elements after said configuration vector has been loaded into said scan chain elements.

10. The circuit of claim 9 wherein said finite state machine is further operable for generating said configuration vector enable signal and activating said configuration vector control signal for a period of time less than said sleep mode.

11. The circuit of claim 9 wherein said finite state machine is further operable for generating a clock gating signal that disables said clocking signal to said scan chain elements.

12. The circuit of claim 4 wherein said configuration vector comprises at least two data and each data in said configuration vector is sequentially loaded into said scan chain elements in response to said clocking signal.

13. A circuit, comprising:
   circuit elements;
   scan chain elements to contain a vector for selective application to said circuit elements;
   means for receiving a test vector;
   means for storing a configuration vector which, when applied to said circuit elements, configures said circuit elements into a state in which a leakage current is reduced;
   means for selecting between said configuration vector and a test vector for loading into said scan chain elements;
   means for a multiplexer to select between a test enable signal and a configuration vector enable signal and output a selected enable signal, said selected enable signal operable for enabling said scan chain elements to select between a first selected vector or a normal operation mode data vector for loading into said circuit elements wherein said multiplexer is controlled by a finite state machine, and wherein the finite state machine comprises sleep, standby and at least one other mode; and
   means for generating a clocking signal to clock a second selected vector into said scan chain elements.

14. A method for reducing leakage currents in a circuit, the method comprising:

providing circuit elements;

providing scan chain elements to contain a vector for selective application to said circuit elements;

receiving a configuration vector from memory which, when applied to said circuit elements, configures said circuit elements into a state in which a leakage current is reduced;

selecting using a first multiplexer between said configuration vector and a test vector for loading into said scan chain elements and outputting a first selected vector wherein the selecting using said first multiplexer is controlled by a finite state machine, and wherein the finite state machine comprises sleep, standby and other modes;

selecting using a second multiplexer between a test enable signal and a configuration vector enable signal and outputting a selected enable signal;

receiving said selected enable signal and said first selected vector, and in response thereto, selecting between said first selected vector and a normal operation mode data vector for loading into said scan chain elements; and generating a clocking signal to clock said vector selected by said selected enable signal into said scan chain elements and applying said clocked vector to said circuit elements.

15. The method of claim 14 further comprising:

configuring said first and second multiplexers to select said configuration vector and to operate said clock generator to clock said configuration vector into said scan chain elements when a sleep mode of said circuit is detected.

16. The method of claim 15 further comprising:

activating during the sleep mode said configuration vector enable signal only for a predetermined number of cycles of said clock generator equal to or less than the number of said scan chain elements.

* * * * *

UNITED STATES PATENT AND TRADEMARK OFFICE
CERTIFICATE OF CORRECTION

PATENT NO. : 7,571,402 B2  Page 1 of 1
APPLICATION NO. : 10/604964
DATED : August 4, 2009
INVENTOR(S) : Razak Hossain It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 898 days.

Signed and Sealed this

Seventh Day of September, 2010

David J. Kappos
*Director of the United States Patent and Trademark Office*